United States Patent
Mulawski et al.

(10) Patent No.: US 8,368,451 B2
(45) Date of Patent: Feb. 5, 2013

(54) HIGH POWER RADIO FREQUENCY (RF) SWITCH

(75) Inventors: Steven A. Mulawski, Tyngsborough, MA (US); Yusuke Tajima, Acton, MA (US)

(73) Assignee: Auriga Measurement Systems, LLC, Chelmsford, MA (US)

( * ) Notice: Subject to any disclaimer, the term of this patent is extended or adjusted under 35 U.S.C. 154(b) by 40 days.

(21) Appl. No.: 13/077,096

(22) Filed: Mar. 31, 2011

(65) Prior Publication Data
US 2011/0241755 A1 Oct. 6, 2011

Related U.S. Application Data

(60) Provisional application No. 61/319,332, filed on Mar. 31, 2010.

(51) Int. Cl.
*H01P 1/22* (2006.01)
(52) U.S. Cl. ..................... 327/308; 333/81 R
(58) Field of Classification Search .............. 327/306, 327/308, 365, 376–377; 333/81 R, 258, 333/262
See application file for complete search history.

(56) References Cited

U.S. PATENT DOCUMENTS

| | | | |
|---|---|---|---|
| 4,929,855 A | 5/1990 | Ezzeddine | |
| 5,191,238 A | 3/1993 | Vasile | |
| 5,818,283 A | 10/1998 | Tonami et al. | |
| 6,804,502 B2 * | 10/2004 | Burgener et al. | 455/333 |
| 7,026,858 B2 * | 4/2006 | Tosaka | 327/427 |
| 7,848,712 B2 * | 12/2010 | Fu et al. | 455/80 |

FOREIGN PATENT DOCUMENTS

| | | |
|---|---|---|
| EP | 1 487 103 A2 | 12/2004 |
| EP | 1 487 103 A3 | 12/2004 |

OTHER PUBLICATIONS

PCT Search Report of the ISA for PCT/US2011/030717 dated Dec. 23, 2011.
Written Opinion of the ISA for PCT/US2011/030717 dated Dec. 23, 2011.
International Preliminary Report on Patentability of the ISA for PCT US/2011/030717 dated Oct. 11, 2012.

* cited by examiner

*Primary Examiner* — Dinh T. Le
(74) *Attorney, Agent, or Firm* — Daly, Crowley, Mofford & Durkee, LLP (57) ABSTRACT

A radio frequency (RF) switch circuit includes switching devices coupled at a common node and a floating control signal circuit (CSS) coupled to the control electrodes of the switching devices and the common node and configured to isolate RF signals from the CSS and configured to provide differential voltage signals to the common node and each of the control electrodes.

23 Claims, 9 Drawing Sheets

HIGH POWER RADIO FREQUENCY (RF) SWITCH

CROSS REFERENCE TO RELATED APPLICATION

This application claims the benefit of provisional application No. 61/319,332 filed on Mar. 31, 2010 under 35 U.S.C. §119(e) which application is hereby incorporated herein by reference in its entirety.

FIELD OF THE INVENTION

The structures and techniques described herein relate to radio frequency (RF) circuits and more particularly to RF switch circuits.

BACKGROUND OF THE INVENTION

As is known in the art, a radio frequency (RF) switch circuit (hereinafter switch or switch circuit) is a device used to connect and disconnect RF signal paths in an electrical circuit. When connecting RF signal paths, a switch generally provides a bi-directional RF signal path. Thus, signals fed to an input port of the switch appear at an output port of the switch and vice-versa.

When an RF switch provides an RF signal path having a relatively low insertion loss characteristic between two ports, the switch is generally referred to as being in the "ON" position. When the switch provides an RF signal path having a relatively high insertion loss characteristic between the common port and the branch port the switch is generally referred to as being in the "OFF" position.

The electrical characteristics of an RF switch include isolation, insertion loss, switching speed and RF power handling capability. Depending upon the particular application, it is often necessary to optimize one of these electrical characteristics by trading off the performance of the other electrical characteristics of the switch.

The isolation and insertion-loss characteristics of an RF switch having a single input port and a single output port are generally determined by providing an RF signal to the input port and measuring the difference between the power level of a signal provided at the switch output port with the switch OFF and with the switch ON, respectively.

Figure 1:
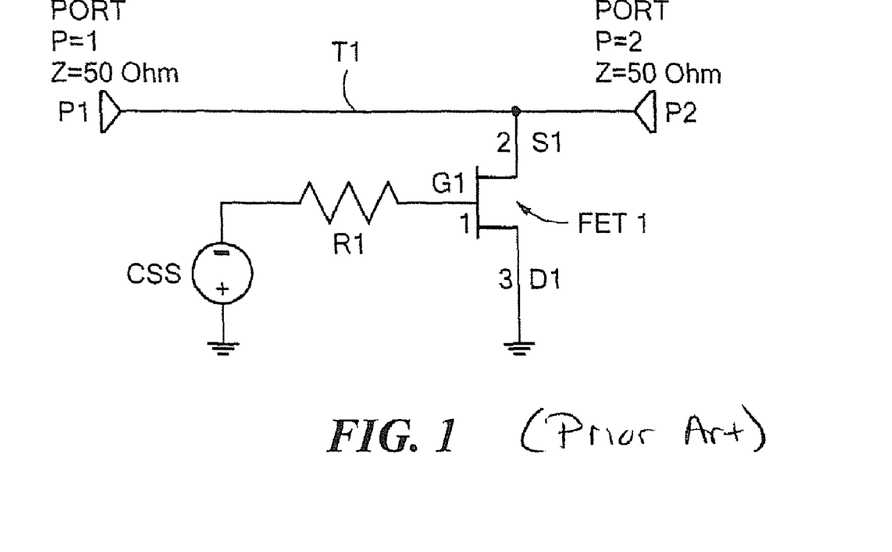
FIG. 1 is a schematic diagram of a prior art radio frequency (RF) switch having a field effect transistor (FET) coupled in shunt to ground with respect to a transmission line connecting ports 1 and 2.

Referring now to FIG. 1, an RF switch includes a transmission line T1 coupled between first and second switch ports P1, P2. A field effect transistor (FET1) acts as a switching element when placed in shunt with transmission line T1. When transistor FET1 is pinched off by applying a negative voltage on a gate terminal G1 beyond a pinch off voltage (typically about −3V), transistor FET1 is provided having a high impedance characteristic between source and drain electrodes S1, D1 (i.e. the transistor FET1 is in its "off" state) and thus an RF signal will propagate along transmission line T1 from port P1 to port P2.

When the bias voltage applied to gate electrode is zero volts or positive, transistor FET1 is provided having a low impedance characteristic between source and drain electrodes S1, D1. That is, the transistor FET1 is biased into its conductive state and thus is in its "on" state. Consequently, an RF signal injected to port P1 will be reflected back to port P1 and will not reach port P2. Thus, FIG. 1 illustrates one embodiment of a conventional switch having a FET shunt coupled to ground with respect to a transmission line connecting ports P1 and P2.

Figure 2:
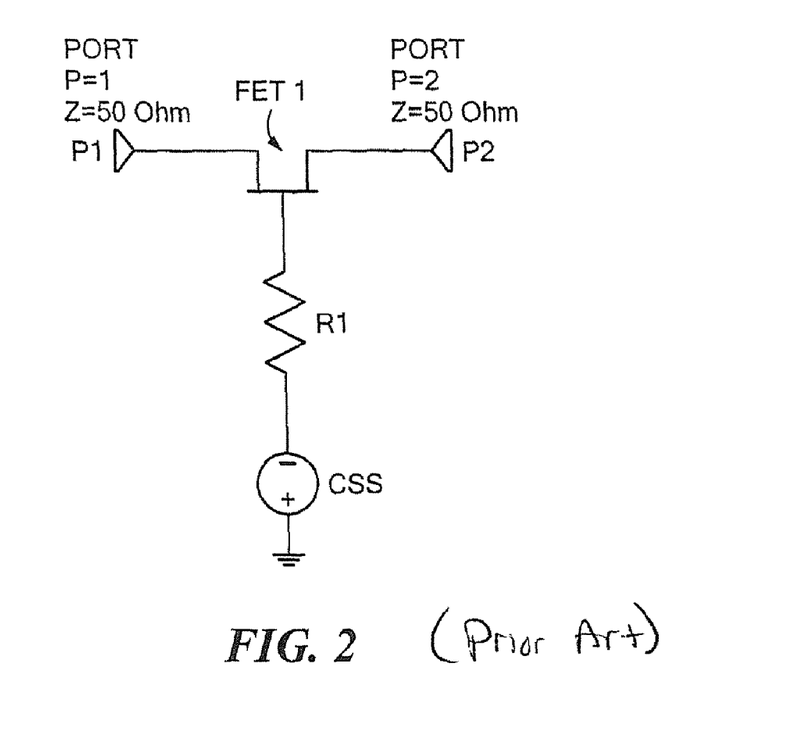
FIG. 2 is a schematic diagram of another embodiment of an RF switch in which a FET is inserted in series with a transmission line connecting ports 1 and 2.

Referring now to FIG. 2, another embodiment of a conventional switch includes a FET inserted in series with a transmission line. When the FET is on (i.e. the FET is biased into its conductive or low impedance state), an injected signal at port P1 is coupled to port P2 through the low impedance signal path provided by the FET. When the FET is off (i.e. the FET is biased into its nonconductive or high impedance state), an injected signal at port P1 will be reflected and will not appear at port P2. Thus, FIG. 2, illustrates a second embodiment of a conventional switch where a switching FET is inserted in series with the transmission line connecting ports P1 and P2.

When an RF signal level is in the range of about 100 watts (W), it generates in the range of about 200 volts peak-to-peak (Vp-p) across a 50 ohm load or draws about 4 amperes peak-to-peak (Ap-p) through a 50 ohm load. Therefore, the first requirement for the FET switch element in the configurations illustrated in FIGS. 1 and 2 is that it must to be capable of handling 4 Ap-p. Secondly, the FET breakdown voltage must be large enough to sustain 200 Vp-p. The gate control voltage for the off state will have to be −100V or less to keep it pinched off when the RF signal swings to −100V. Maximum differential voltage between the drain and gate will reach 200V when the RF signal swings to +100V while the control voltage on the gate is maintained at −100V. It is thus necessary for the FET breakdown voltage to be larger than 200V. This is a difficult requirement for the device.

SUMMARY OF THE INVENTION

In accordance with the concepts, systems and techniques described herein, a radio frequency (RF) switch having a first port and a second port includes a transmission line extending between the first and second ports of the RF switch and a switch element coupled between the transmission line and a first reference potential. The switch element includes: a first plurality of transistors connected in a cascade configuration at a common node to make a four terminal device having two control electrodes and two ohmic nodes with a first one of the ohmic nodes coupled to the transmission line and a second one of the ohmic nodes coupled to a first reference potential and a first control circuit coupled to provide a floating voltage to the control electrodes and the common node and configured to isolate RF signals from the control circuit and configured to provide differential voltage signals to the common node and each of the control electrodes.

With this particular arrangement, a shunt switch element is provided. By utilizing a control circuit which provides a floating voltage to terminals of the transistors and a common node, the switch element described herein can switch relatively large RF signal voltages using relatively small control voltages. In one embodiment the transistor control electrodes can correspond to gate electrodes of the transistor in which case the floating voltage control circuit corresponds to a gate control circuit In one embodiment, the gate control circuit includes a floating voltage source and a plurality of resistors, with a first one of the resistors coupled between a first terminal of the floating voltage source and a gate electrode of a first transistor, a second one of the resistors coupled between the first terminal of said floating voltage source and a gate electrode of a second transistor and a third one of the resistors coupled to a second terminal of said floating voltage source and the common node.

In one embodiment, the RF switch further comprises a second switch element coupled between the transmission line and the first reference potential and the second switch element further includes a second plurality of transistors connected in a cascade configuration at a second common node to make a four terminal device having two gate electrodes and two ohmic nodes with a first one of the ohmic nodes coupled to said transmission line and a second one of the ohmic nodes coupled to a first reference potential wherein the gate electrodes are configured to receive a floating voltage from said gate control circuit and wherein said gate control circuit is configured to provide differential voltage signals to the second common node and each of the gate electrodes of said second plurality of transistors.

In some embodiments two of the switching elements with floating voltage control may be used with one in series and the other one in shunt with the transmission line and configured to receive two differential voltages (one near 0 or positive and the other beyond pinch off) which are applied to make the transmission line switch from a low insertion loss state to a high insertion state.

In some embodiments, the switch elements may be used to provide one by two (1×2) switch using multiple switch element (e.g. two 1×1 switches).

In some embodiments multiple switch elements may be arranged in either or both of shunt and series configurations.

In one embodiment, an n×m switch may be provided using multiple floating voltage switching elements.

In accordance with a further aspect of the concepts described herein, a galvanically isolated or "floating", differential bias circuit is provided which allows for relatively low voltage positive and negative switch bias voltage levels, to individual switch elements, or groups of switch elements such that the topology negates the need for high-voltage switching devices (e.g. high voltage FETs) and resulting higher switch biasing, normally found in common referenced switches.

In one embodiment, a floating voltage switch includes a transformer coupling of switch bias power, by utilizing a DC-DC conversion transformer to couple isolated bias power into an RF switch function.

A radio frequency (RF) switch having first and second ports and including a transmission line extending between the first and second ports of the RF switch, a first transistor having first, second and third electrodes with a first one of the first, second and third electrodes coupled to the transmission line and a second one of the first, second and third electrodes corresponding to a control electrode; a second transistor having a first, second and third electrodes, with a first one of the first, second and third electrodes coupled to a third one of first, second and third electrodes of said first switch to provide a common node and a second one of the first, second and third electrodes corresponding to a control electrode; a first resistor having a first terminal coupled to the common node and a second terminal; a second resistor having a first terminal coupled to the control electrode of said first transistor and having a second terminal; and a third resistor having a first terminal coupled to the control electrode of said second transistor and having a second terminal and a control circuit configured to provide a floating voltage to control terminals of the transistors.

In one embodiment the switch includes a reference potential corresponding to a negative voltage source.

In one embodiment, the control circuit provides a potential difference to control electrodes with is either positive or negative depending upon the type of switching element used in the switch (e.g. enhancement mode or depletion mode FETs, for example).

In one embodiment, one reference potential corresponds to one of a +10 volt voltage source or a −10 volt voltage source.

In one embodiment, one reference potential corresponds to one of a +2 volt voltage source or a −2 voltage source.

In accordance with a still further aspect of the concepts described herein, an RF switch having first and second ports with series switching elements disposed therebetween includes a first transistor having first, second and third electrodes with a first one of the first, second and third electrodes coupled to the first port of the RF switch and a second one of the first, second and third electrodes corresponding to a control electrode; a second transistor having a first, second and third electrodes, with a first one of the first, second and third electrodes coupled to a third one of first, second and third electrodes of said first switch to at a common node, a second one of the first, second and third electrodes corresponding to a control electrode and a third one of the first, second and third electrodes coupled to the second port of the RF switch; a first resistor having a first terminal coupled to the control electrode of said first transistor and having a second terminal configured to couple to a first terminal of a reference potential; a second resistor having a first terminal coupled to the common node and having a second terminal configured to couple to a second, different terminal of a reference potential; and a third resistor having a first terminal coupled to the control electrode of said second transistor and having a second terminal configured to couple to the first terminal of a reference potential.

The RF switch of claim 19 further comprising a reference potential having a first terminal coupled to the second terminal of said first resistor and to the second terminal of said second resistor and having a second terminal coupled to the second terminal of said third resistor such that a floating voltage is applied to the common node.

BRIEF DESCRIPTION OF THE DRAWINGS

The foregoing features of this invention, as well as the invention itself, may be more fully understood from the following description of the drawings in which.

DETAILED DESCRIPTION OF THE PREFERRED EMBODIMENTS

Figure 3:
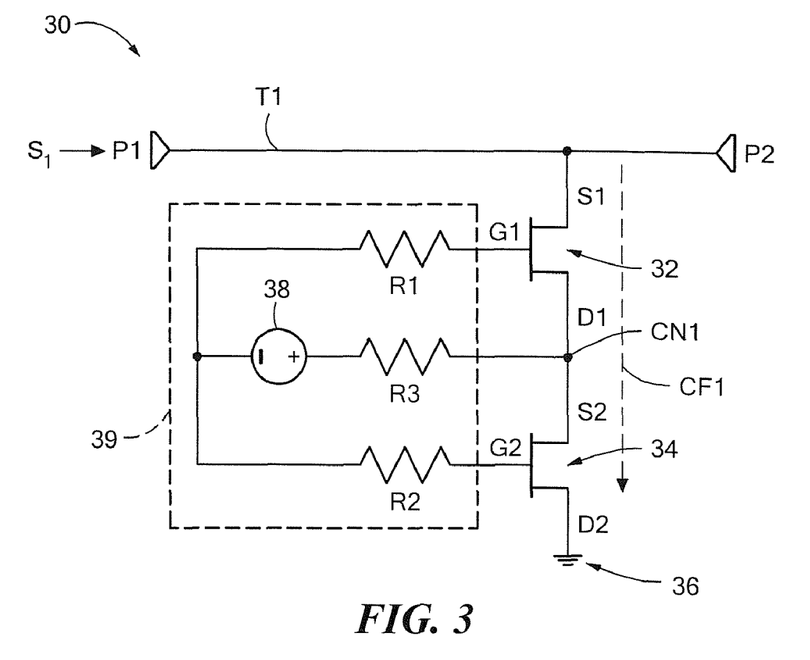
FIGS. 3-3D are a series of schematic diagrams showing series coupled transistors (e.g. FETs) connected at a common node and inserted in a shunt configuration with respect to a transmission line and having a gate control circuit(s) coupled thereto.
Figure 3A:
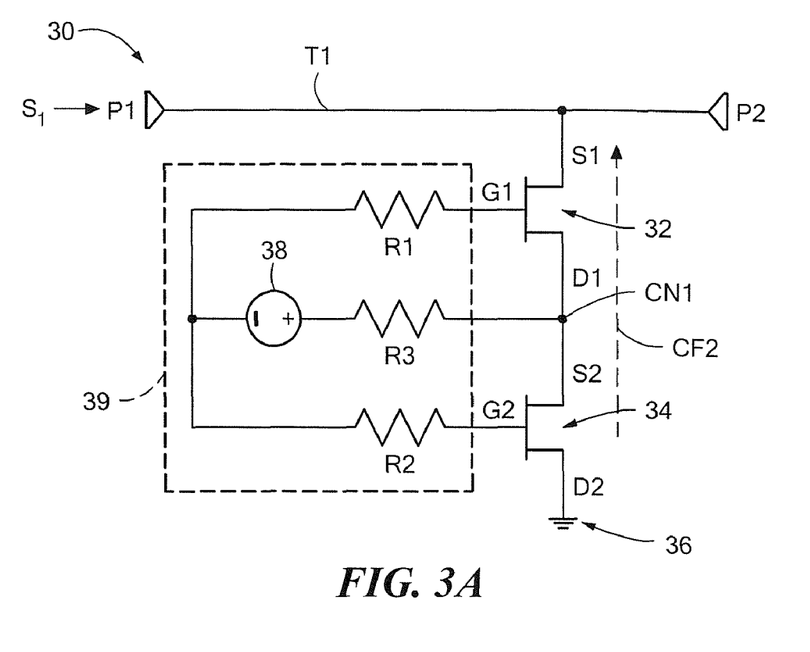

Referring now to FIGS. 3 and 3A, in which like elements are provided having like reference designations, a radio frequency (RF) switch 30 comprises a transmission line T1 coupled to provide a signal path between first and second switch ports (designated P1 and P2, respectively in FIGS. 3 and 3A). In this exemplary embodiment, transmission line T1 is provided having a characteristic impedance of 50Ω presented at ports P1, P2.

This may be accomplished by providing the transmission line itself with a 50Ω characteristic impedance or by utilizing impedance transformers or impedance matching networks at ports P1, P2 to provide a 50Ω impedance at ports P1, P2 at a desired frequency or over a desired frequency range.

It should be appreciated that in some applications, it may be desirable to utilize a characteristic impedance which is different than 50Ω. Those of ordinary skill in the art will understand how to select a particular characteristic impedance for transmission line T1 and at ports P1, P2. Such selection is made based upon a variety of factors including but not limited to the needs of the particular application in which switch 30 will be utilized.

RF switch 30 also includes a pair of transistors 32, 34 series coupled between transmission line T1 and a first reference potential 36 (i.e. the transistors are in a shunt configuration with respect to transmission line T1). In this exemplary embodiment, the reference potential 36 corresponds to ground, but in other embodiments, a reference potential other than ground may be used.

It should be appreciated that in the exemplary embodiment of FIGS. 3 and 3A, the transistors 32, 34 are shown as field effect transistors (FETs). FETs are preferred due to the low gate current required to switch the FET between its conductive and non-conductive states. Metal oxide semiconductor (MOS) FETs or any other type of FET may be used. For example gallium-nitride (GaN) FETs may be used as well as any gallium-arsenide (GaAs) FETs or FETs provided from any other Group III-V materials. It should, of course, be appreciated that any type of switching devices (including other three-terminal devices) which requires a relatively low amount of current to switch states may also be used.

Each of the FETs 32, 34 have gate, source and drain electrodes designated G1, S1, D1 and G2, S2 D2, respectively. Transistor 32 is disposed having a source electrode S1 coupled to transmission line T1 and drain electrode D1 coupled to a common node CN1. Transistor FET2, is disposed having a source electrode S2 coupled to common node CN1 and drain electrode D2 coupled to a first reference potential, here corresponding to ground although other reference potentials could also be used. The gate electrodes G1, G2 of each FET 32, 34 are coupled to a second reference potential through respective resistors R1, R2. A third resistor R3 is coupled between the common node CN1 and a first terminal of a floating control signal source (CSS) 38.

CSS 38 applies a floating voltage control signal between common node CN1 and gate terminals of each FET 32, 34. Significantly, the control signal is floating and RF isolation is accomplished by resistors R1, R2, R3. As is known, the phrase "floating voltage" (or "galvanically isolated") refers to the fact that the voltage provided by control signal source 38 is not relative to ground of switch 30. Floating signal source 38 can be provided via conventional circuits and techniques. It should be noted that floating control signal source 38 and resistors R1, R2, R3 are sometimes collectively referred to herein as a floating CSS circuit 39.

It should be appreciated that in the prior art switch applications described above in conjunction with FIG. 1 which utilize field effect transistors (FET) as switching elements, a gate voltage applied to a gate electrode of the FET by CSS must be made low enough to maintain the FET in its pinch-off state when an RF voltage swing is applied to port P1. If the RF voltage swing becomes large enough to keep the FET in pinch-off condition, the FET may become conductive and this would prevent the FET from providing a high impedance signal path to ground. This condition would result in the switch having an insertion loss characteristic which is higher than desired (i.e. the switch would be lossy) when the switch is an "ON" position (i.e. when the switch is intended to provide a low insertion loss signal path between ports P1, P2).

As illustrated in FIG. 3, with control signal source CSS providing a gate control voltage of negative ten volts (−10V) to gate electrodes G1, G2 through resistors R1, R2 and to common node CN1 through resistor R3, when a relatively large signal (e.g. +100V) is presented to switch port P1 (i.e. the signal swings to +100V), current will flow in a direction from RF transmission line T1 to ground 36 as indicated by dashed line CF1. Gate G1 of FET 32 will be negatively biased with respect to the common node CN1 (which becomes the source of FET 32). Therefore FET 32 will be biased into its pinched off state thereby taking up most of the voltage drop between RF transmission line T1 and ground.

As illustrated in FIG. 3A, when the signal presented at port P1 swings to −100V (and with CSS providing the same gate control voltage of negative ten volts −10V), current will flow in a direction from ground 36 to RF transmission line T1 as indicated by dashed line CF2. Gate G2 of FET 34 will be negatively biased with respect to the common node CN1 (which becomes the source of FET 34), therefore FET 34 will be biased into its pinched off state, taking up most of the voltage drop between the RF transmission line T1 and ground. As a result, the RF signal swing of +/−100V is carried between FET1 and FET2, with each carrying 100V. With this approach, the breakdown voltage requirement of each FET 32, 34 is now reduced to 100V from 200V which is what would be required using a traditional switch configuration.

It is also noted that the control voltage needed will be only 10V (rather than 100V which is what would be necessary in a conventional switch circuit).

To provide the signal path between ports P1 and P2 with a relatively high insertion loss characteristic (i.e. to set the switch in an "OFF" position), control signal source CSS 39 provides a gate control voltage of positive two volts (+2V) to gate electrodes G1, G2 through resistors R1, R2 with respect to common node CN1 through resistor R3.

Thus, in a shunt switch configuration using the floating voltage gate control circuit described above, a relatively small range of control voltages (−10V to +2V) are used to bias gate electrodes G1, G2 in a manner which allows FETs 32, 34 to maintain OFF and ON conditions for an RF voltage swing up to +/−100V.

It should thus be appreciated that the switch circuit described herein in conjunction with FIGS. 3 and 3A a floating voltage is used to allow switching of high power RF signals with a control signal which varies over a relatively small voltage range. In the embodiment of FIGS. 3 and 3A, for example, a voltage of only 10V need be applied across resistor R3 to support an RF voltage signal swing of ±100V.

This in contrast to prior art approaches in which a wide range of control voltage is needed.

In the embodiment of FIGS. 3 and 3A, using only −10 V floating can always bias one of the FETs 32, 34 into conduction or non-conduction states. Thus a ±100V RF swing can be controlled with a ±10V control signal to gate electrodes of the FETs 32, 34.

Figure 3B:
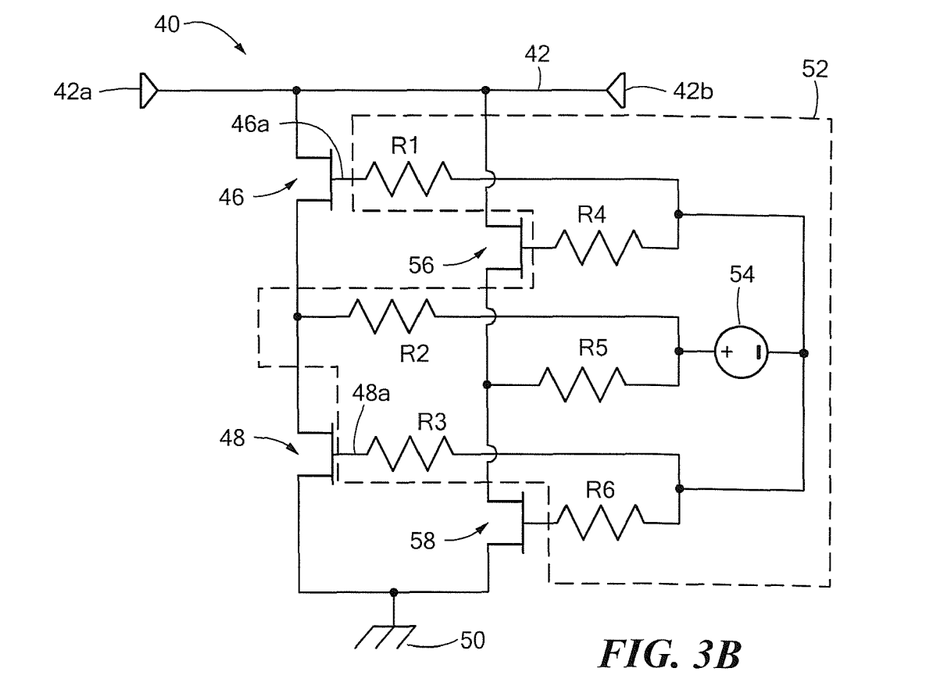
Figure 3C:
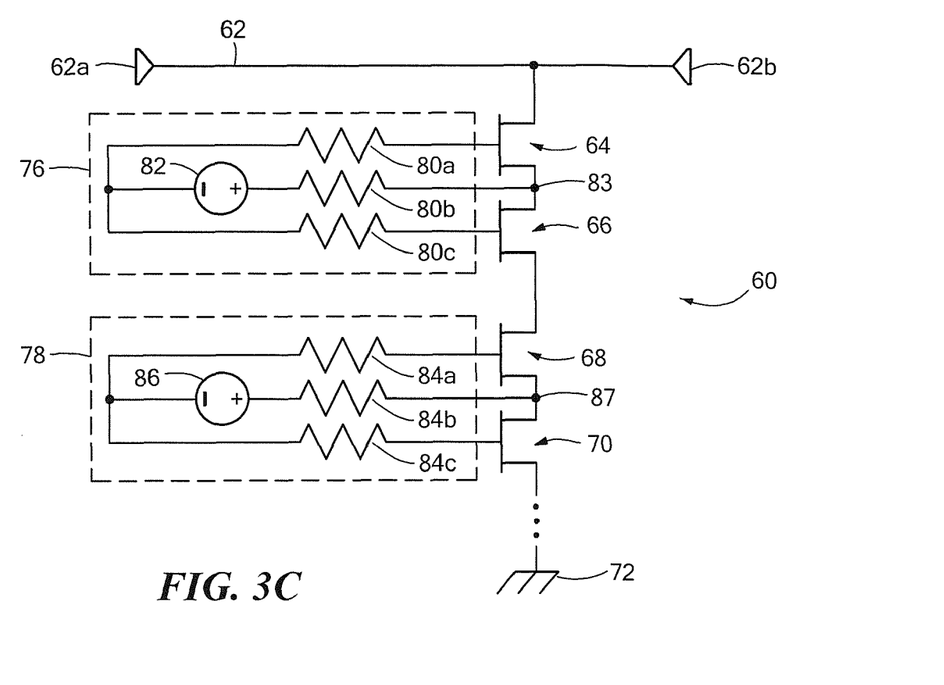
Figure 3D:
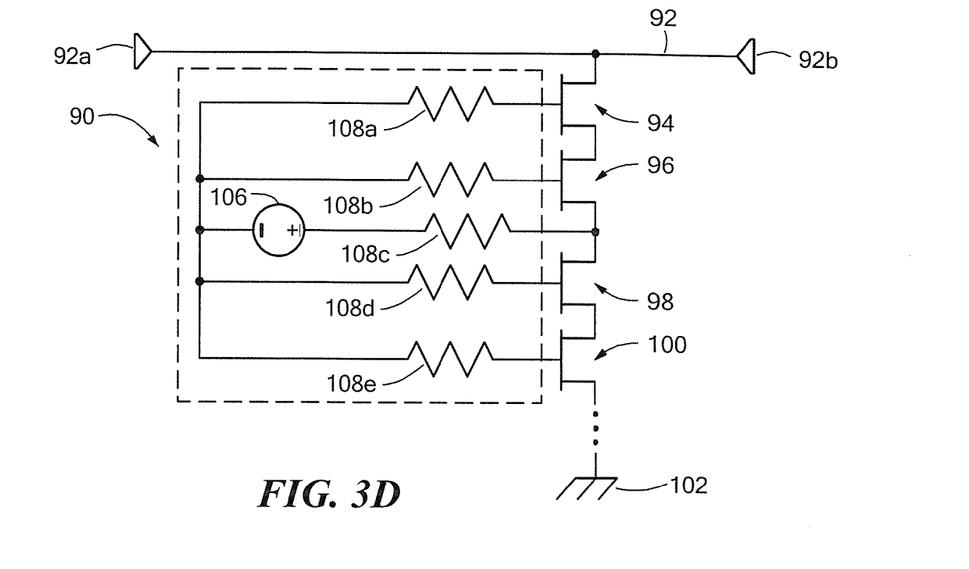

While the exemplary embodiment of FIGS. 3 and 3A utilize a pair serially coupled transistors shunt coupled across transmission line T1, it is possible to utilize parallel coupled pairs of serially coupled transistors or more than one pair of transistors per shunt leg or both parallel coupled shunt legs each having two or more transistors. The number of transistors in each leg need not be the same (i.e. it is not necessary that symmetry exist in a single shunt leg nor between parallel coupled legs). Such alternate embodiments may be desirable to provide the switch having improved current handling capability, for example. Examples of such embodiments are illustrated in FIGS. 3B-3D. It should be appreciated that other embodiments are also possible (i.e. embodiments other than those specifically shown herein) and that any such embodiment are considered to be within the scope of this disclosure.

Referring now to FIG. 3B, an RF switch 40 suitable for use in high power RF applications includes a signal path 42 having first and second ports 42a, 42b. A first pair of switching devices 46, 48, are series coupled between signal path 42 and a reference potential 50. Switching devices 46, 48 are each provided having control terminals 46a, 48a. A second pair of switching devices 56, 58 are also series coupled from signal path 42 to reference potential 50. Switching devices 56, 58 are each provided having control terminals 56a, 58a.

Control terminals 46a, 48a, 56a, 58a are coupled to a control signal source (CSS) circuit 52, comprised of resistors R1-R6. A floating source 54 is here shown in phantom since it need not necessarily be a part of the CSS circuit 52, although in some applications floating source 54 may be provided as part of CSS circuit 52. In those applications in which floating source 54 is not provided as part of CSS circuit 52, CSS circuit 52 is configured to be appropriately coupled to floating source 54. As illustrated in FIG. 3B, a single floating source is coupled to switching devices 46, 48, 56 and 58. Thus, each switching device 46, 48, 56, 58 receives the same floating voltage. This assumes, of course, that each resistor R1-R6 has the same value. In some applications, it may be desirable to provide one or more resistors (or even each resistor) having different values. For example, in some cases it may be advantageous to use different resistor values and it may also be necessary to add a combination of resistor, inductor, and possibly capacitor, to provide the necessary filtering properties, as the circuit technique described herein can function at any frequency.

It should, however, also be appreciated that in some embodiments, more than one floating source may be used. For example, a first floating source may be coupled to switching devices 46, 48 and a second different floating source may be coupled to switching devices 56, 58. The different floating sources may provide different floating voltages to each of the switching devices 46, 48, 56, 58.

Each of the signal paths provided by switching devices 46, 48, 56, 58 operate in a manner similar to that described above in conjunction with FIGS. 3 and 3A with respect to FETs 32, 34. In particular, when a relatively large RF signal is provided at switch port 42a, if source 54 provides a voltage of approximately −10V to bias the FETS into their conduction states, in which case switch 40 provides a high impedance signal path between ports, 42a, 42b (i.e. switch 40 is "OFF"). If source 54 provides a voltage of approximately +2V, then FETS 46, 48 are biased into their non-conduction states in which case switch 40 provides a low impedance signal path between ports 42a, 42b (i.e. switch 40 is "ON").

It should be appreciated that switching devices 46, 48, 56, 58 may also be provided as FETs but other switching elements may also be used including but not limited to metal oxide semiconductor (MOS) FETs or any other type of FET. For example gallium-nitride (GaN) FETs may be used as well as any gallium-arsenide (GaAs) FETs or FETs provided from any other group III-V materials. It should, of course, be appreciated that any type of switching devices (including other three-terminal devices) which requires a relatively low amount of current to switch states may also be used.

It should also be appreciated that the FETs may be provided as either enhancement or depletion mode devices (e.g. enhancement or depletion mode FET's such as depletion mode GaN FETs) and that after reading the description provided herein, those of ordinary skill in the art will understand how to provide the necessary floating voltages to the FET control electrodes to achieve a desired switching operation.

Referring now to FIG. 3C, a high power RF switch 60 includes a signal path 62 having first and second ends 62, 62b. A plurality of transistors, here four transistors 64, 66, 68, 70, are series coupled between transmission line 62 and a reference potential 72. Each of transistors 64, 66, 68, 70 has a control terminal 64a, 66a, 68a, 70a and each control terminal 64a-70a is coupled to one of a pair of control signal source (CSS) circuits 76, 78. CSS circuit 76, comprises a source 80, and a plurality of resistors 80a, 80b, 80c with first ones of the resistors 80a, 80c having a first electrode coupled to a negative terminal of source 82 and a second electrode coupled to respective ones of control terminals 64a, 66a. Resistor 80b has a first electrode coupled to a positive terminal of source 82 and a second terminal coupled to a common node 83.

Similarly, CSS circuit 78 comprises a source 86 and a plurality of resistors 84a, 84b, 84c with first ones of the resistors 84a, 84c having a first electrode coupled to a negative terminal of source 86 and second electrodes of resistors 84a, 84c coupled to respective ones of control terminals 68a, 70a. Resistor 84b has a first electrode coupled to a positive terminal of source 86 and a second terminal coupled to a common node 87.

Switch 60 operates in a manner similar to switch 30 described above in conjunction with FIG. 3. However, since switch 60 utilizes a large number of switching elements, than switch 60 provides a higher level of isolation than does switch 30.

Referring now to FIG. 3D, a high power RF switch 90 includes a signal path 92 having first and second ports 92a, 92b. A plurality of transistors, here four transistors 94, 96, 98, 100, are series coupled between signal path 92 and a reference potential 102. Transistor control electrodes 94a-100a are each coupled to a CSS circuit 104 which includes a single signal source 106 and a plurality of resistors 108a-108d. RF switch 90 provides an isolation characteristic similar to RF switch 60 discussed above in conjunction with FIG. 3c, but in some respects RF switch 90 is simpler since CSS circuit 104 includes only one signal source rather than two signal sources.

Figure 4:
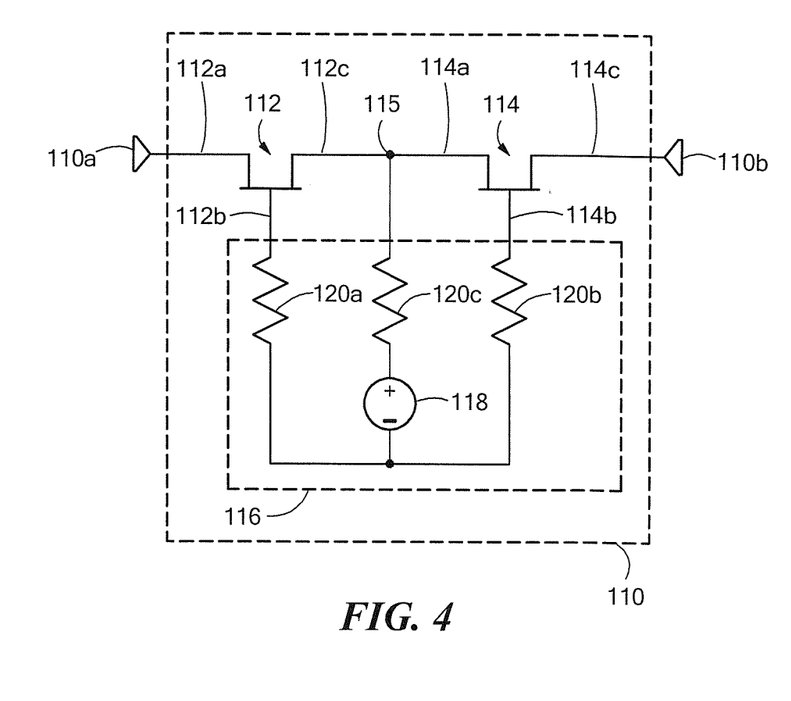
FIGS. 4-4C are a series of schematic diagrams showing series coupled transistors (e.g. FETs) and inserted in a series configuration with respect to a transmission line and having gate control circuit(s) coupled thereto.

Referring now to FIG. 4, a switch 110 having first and second ports 100a, 110b comprises first and second switching devices 112, 114 each having first, second and third electrodes 112a, 112b, 112c, 114a, 114b, 114c, respectively. Electrodes 112c and 114a are coupled at a common node 115. Electrodes 112b, 114b correspond to control electrodes of the respective switching devices 112, 114 and are each coupled to a floating control signal source (CSS) circuit 116 which provides a floating voltage signal to control electrodes 112b, 114b and to common node 115.

CSS circuit 116 comprises a signal source 118 and a plurality of resistors 120a, 120b, 120c. Resistors 120a, 120b each have a first electrode coupled to a respective one of control terminals 112b, 114b and second electrodes coupled to a negative terminal of source 118. Resistor 120c has a first electrode coupled to a common node 115 and a second electrode coupled to a positive terminal of source 118.

In one embodiment, switching devices are provided as FETs with electrodes 112a, 112b, 112c corresponding to source, gate and drain electrodes, respectively. It should of course be appreciated that other types of transistors or switching devices may also be used.

Switch 110 thus utilizes a series switch configuration and CSS or a gate control circuit to provide a selection of a signal path having a relatively low insertion loss characteristic between ports 110a and 110b (i.e. to set the switch in an "ON" position) and having a relatively high insertion loss characteristics (i.e. to set the switch in an "OFF" position". CSS circuit 16 118? provides a gate control voltage of positive two volts (+2V) with respect to common node 115 when "ON" and negative "−10V" when "OFF". Thus, when both gate electrodes are biased to +2V relative to common node 115, both transistors 112, 114 are biased into their conductive states (i.e. the FETs are on) and a signal path between ports 110a, 110b having a relatively low insertion loss characteristic is provided. A relatively high power RF signal (e.g. a 100 W RF signal) will generate a current swing of 4 A p-p across FETs 112, 114.

Figure 4A:
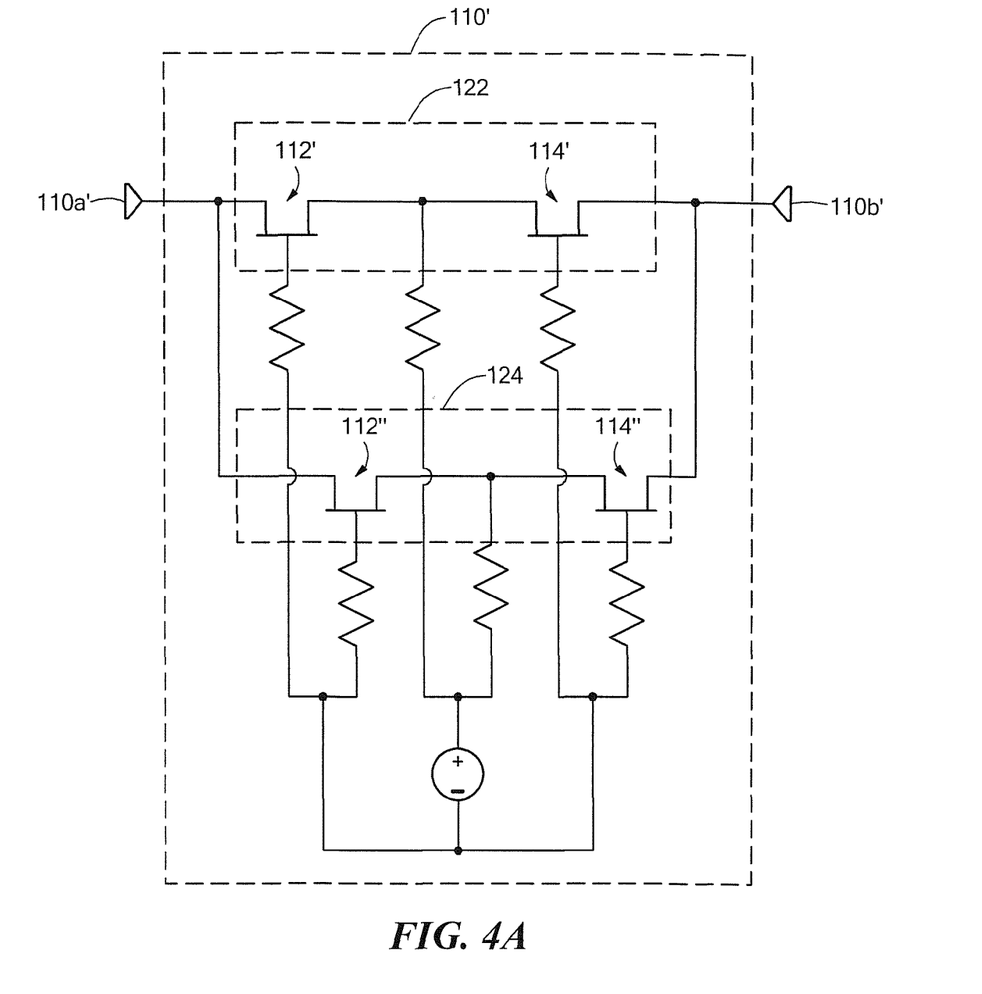
Figure 4B:
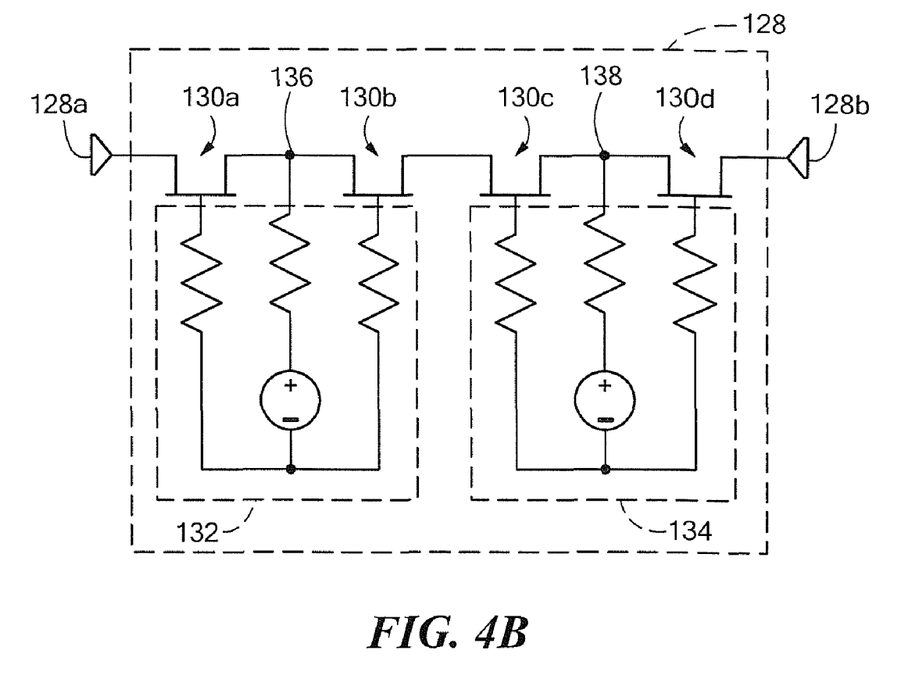

While the exemplary embodiment of FIG. 4 utilizes a pair of transistors serially coupled between switch ports 110a, 110b, it is possible to utilize additional serially coupled transistors between ports 110a, 110b (as shown in FIG. 4B) or additional serial legs (i.e. two serial legs coupled in parallel between ports 110a, 110b as shown in FIG. 4A) or both parallel coupled serial legs each having two or more transistors. The number of transistors in each leg need not be the same (i.e. it is not necessary that symmetry exist in a single serial leg nor between parallel coupled serial legs). Such alternate embodiments may be desirable to provide a switch having improved voltage handling capability, for example. While examples of such additional embodiments are illustrated in FIGS. 4A-4C, it should be appreciated that other embodiments are also possible (i.e. embodiments other than those specifically shown herein) and that any such embodiment are considered to be within the scope of concepts described herein.

It should be appreciated that switch 110' of FIG. 4A is similar to switch 110 in FIG. 4, but switch 110' includes parallel paths 122, 124 each of which includes transistors 112', 114', 112", 114" coupled to a CSS circuit which provides floating voltages to control electrodes of the transistors and to respective common nodes in each parallel path 122, 124. By providing parallel paths, switch 110' is provided having an insertion loss characteristic which is lower than a switch having only a single path (such as switch 110 in FIG. 4).

Referring now to FIG. 4B a switch 128 having first and second ports 128a, 128b includes four transistors 130a-130d serially coupled between ports 128a, 128b. Switch 128 includes a pair of CSS circuits 132, 134 each of which is coupled to a respective one of control electrodes of transistors 130a-130d. CSS circuits 132, 134 may be the same as or similar to CSS circuits described above in conjunction with FIGS. 3-4A and provide floating voltages to the control electrodes of transistors 130a-130d.

Figure 4C:
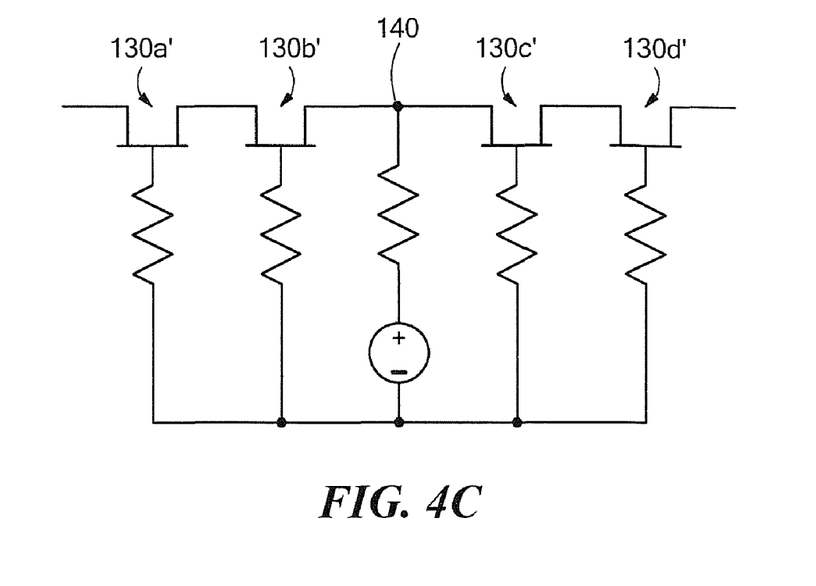

Referring now to FIG. 4C, a switch 128' having first and second ports 128a, 128b includes a plurality of transistors, here four transistors 130a'-130'd. Transistors 130a'-130d' may be the same as or similar to transistor 130c-130d described above in conjunction with FIG. 4B. Switch 128' has a single CSS circuit coupled to control electrodes of transistors 130a'-130d' and a single common node 140.

Figure 5:
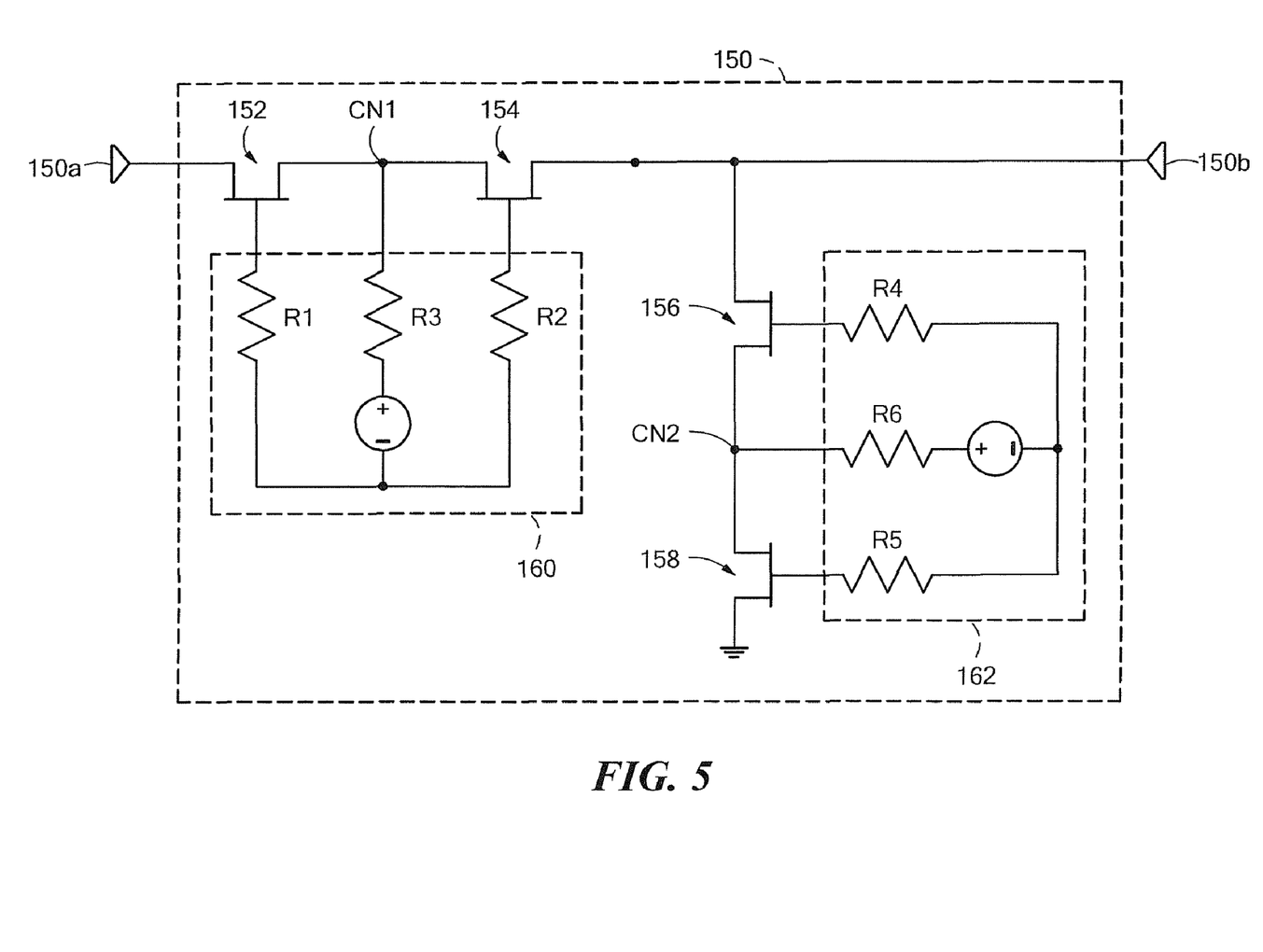
FIG. 5 is a schematic diagram of a circuit in which series and shunt switches are used to configure a switch having a single input and a single output (or a 1×1 switch).

Referring now to FIG. 5, an exemplary single input-single output (1×1) switch 150 having first and second ports 150a, 150b each with a 50Ω impedance characteristic, includes both series configured FETs 152, 154 and shunt configured FETs 156, 158 with each of the FET configurations coupled to a respective one of a pair of CSS circuits 160, 162 (e.g. a gate control circuits). This combined configuration of series and shunt switches provides not only an additional isolation when the switch is set to OFF but high impedance at port 150a when the switch is OFF. This allows additional paths to be added to port 1 to build a switch with multiple output ports. To provide the signal path between ports 150a, 150b with a relatively low insertion loss characteristic (i.e. to set the switch in an "ON" position) the signal source of CSS circuit 160 provides a control voltage of positive two volts (+2V) with respect to a common node CN1, while signal source of CSS circuit 162 provides a gate control voltage of negative ten volts (−10V) with respect to common node CN2. Thus, control bias conditions shown in FIG. 5 are for overall switch ON or a minimum loss condition for the transmitting signal. It should be appreciated that FETs with a breakdown voltage of 100V would be appropriate for 100 W switches. Those of ordinary skill in the art, after reading the description provided herein would understand how to select particular values for resistors R1-R6 taking into account a variety of factors including, but not limited to, circuit design parameters such as gate current, switching speed, and RF isolation.

Figure 6:
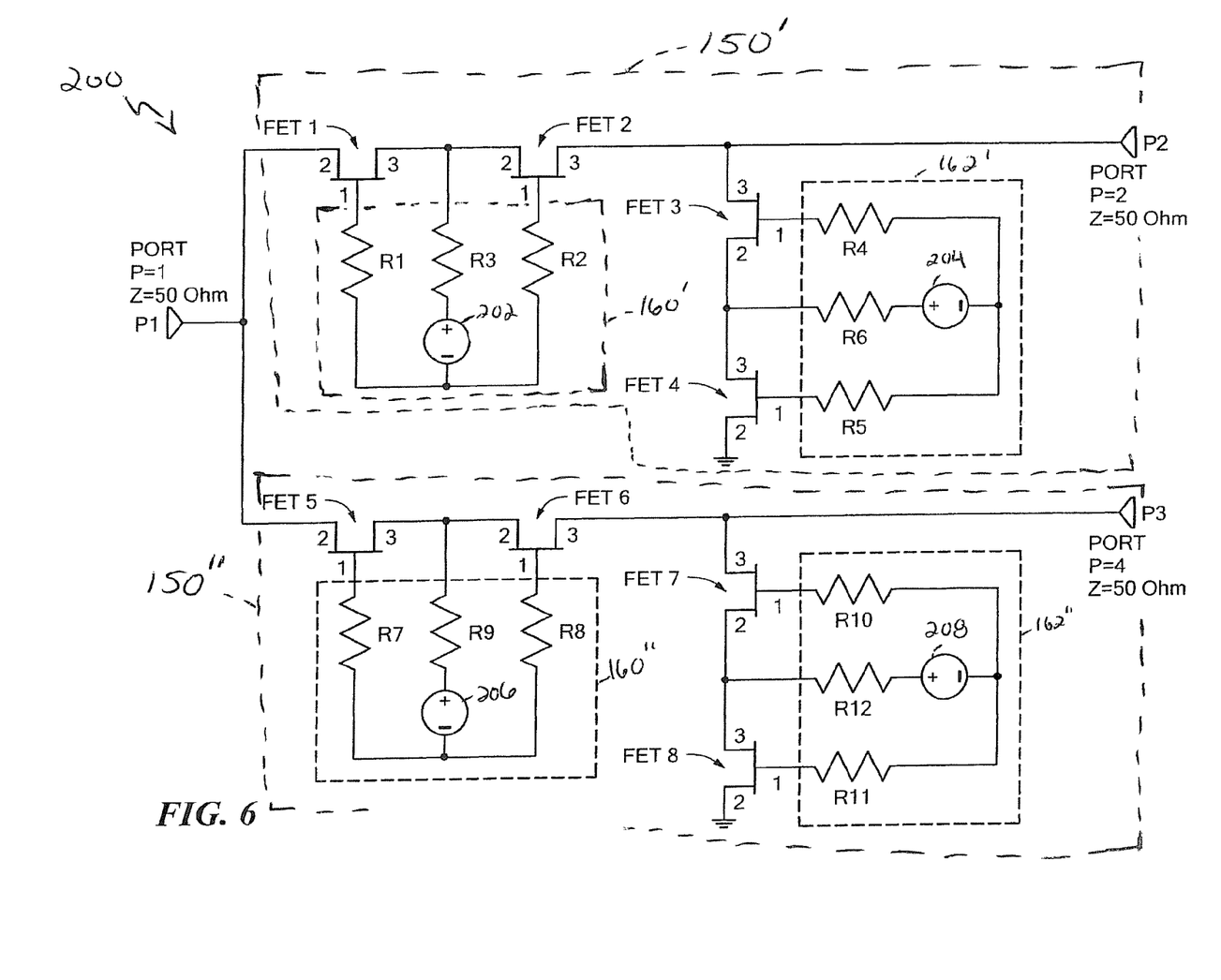
FIG. 6 a diagram of a switch having a single input and two outputs (or a 1×2 switch) with a gate control bias condition set to rout the signal from port 1 to port 2 or from port 2 to port 1.

Referring now to FIG. 6, an exemplary single input-two output (1×2) switch 200 constructed from two 1×1 switches 150', 150" has a first switch port designated P1, a second switch port designated P2 and a third switch port designated P3. Each of the ports P1, P2, P3 has a 50Ω impedance characteristic. Switches 150', 150" may each be the same as or similar to switch 150 described above in conjunction with FIG. 5 and thus include CSS circuits 160', 162', 160", 162", respectively.

With the control bias condition set such that source 202 provides +2V, source 204 provides −10V, source 206 provides −10V and source 208 provides +2V, a signal injected at switch port P1 will be routed to switch port P2 and substantially no signal will appear at port P3 (i.e. port P3 will be highly isolated from ports P1, P2).

Setting the control bias condition such that source 202 provides −10V, source 204 provides +2V, source 206 provides +2V and source 208 provides −10V routes a signal between switch ports P1 and P3.

As can be seen in the figures described herein, resistors are most often used as devices to isolate the RF signals from the control circuit. A large amount of leakage current through gate terminals will cause an uncontrollable voltage drop in the resistor. The approach described herein significantly reduces or in some cases even minimizes the leakage current because the requirement of control voltage range has been greatly reduced.

It should be appreciated that conventional switch configurations such as that shown in FIG. 1, required −100V on the gate to handle 100 W of signal and up to 200V differential voltage.

In the switch configuration described herein, however, the gate control voltage may be as small as −10V, with differential voltage 100V+. Thus, since the transistors in the circuits provided in accordance with the concepts described herein need not accommodate swings in gate control voltages which are as wide as in prior art techniques, the transistors used in the novel switch configurations described herein may be less expensive than those required in prior art approaches.

Figure 7:
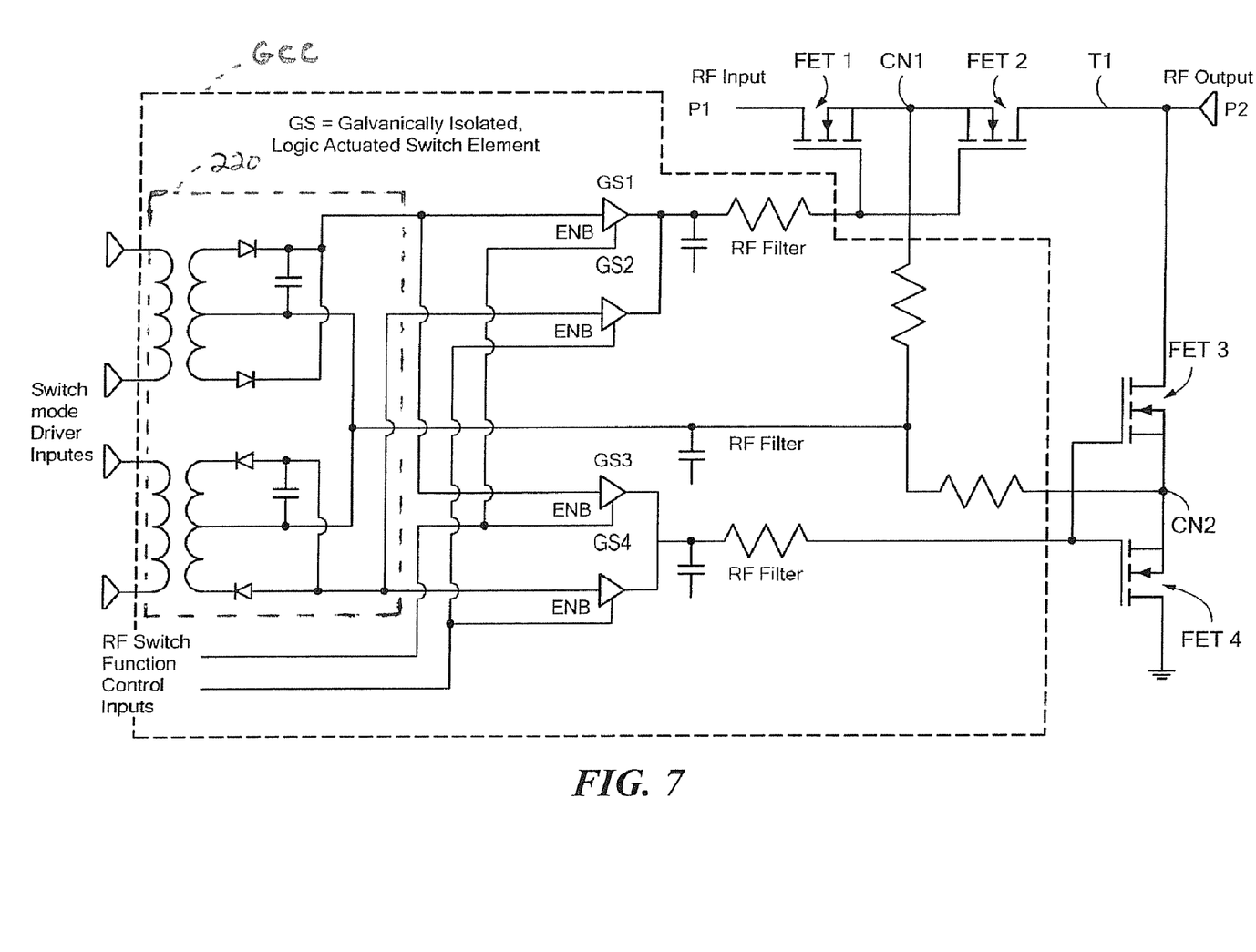
FIG. 7 is a schematic diagram which illustrates advantages of a galvanically isolated or floating, low voltage FET bias circuit.

Referring now to FIG. 7, a circuit which illustrates advantages of galvanically isolated (or floating), low voltage, logic-actuated switch circuits includes four transistors FET1-FET4 with transistors FET1, FET2 corresponding to series configured FETs between switch ports P1, P2 and transistors FET3, FET4 shunt coupled to transmission line T1 between switch port P2 and series coupled transistors FET1, FET2.

Each of the FET configurations provided from transistors FET1-FET4 are coupled to a gate control circuit GCC. The GCC show in FIG. 7 includes filter elements which provide isolation between the GCC section and the RF switch section. The GCC of FIG. 7 also includes a galvanically isolated DC voltage source 220. It should be noted that GCC of FIG. 7 is an example of a particular implementation of a control signal source circuit such as the types described above in conjunction with FIGS. 3-6. Those of ordinary skill in the art will appreciate that gate control circuits may be implemented using a variety of techniques and implementation details which are different than what is shown in FIG. 7 and any GCC implementation may be used as long as the requisite floating voltages (as described herein and below) are provided to the appropriate transistor electrodes. Thus, the GCC of FIG. 7 is intended to be exemplary only and to aid in the description of the concepts described herein and is not intended to be and should not be construed as limiting the scope of the concepts described and claimed herein.

In one exemplary embodiment, to provide a signal path between switch ports P1 and P2 with a relatively low insertion loss characteristic (i.e. to set the switch in an "ON" position) GCC provides a control voltage of positive two volts (+2V) with respect to common node CN1 and a control voltage of negative ten volts (−10V) with respect to common node CN2.

GCC includes logic activated switch elements GS1-GS4 each of which has an input port coupled to switch mode, or resonant mode driver inputs through transformers and a switch control port configured to receive RF switch function control input signals. When switch elements GS1-GS4 are in their off positions, switch pairs FET1-FET2 and FET3-FET4 are electrically (galvanically) isolated from the gate control circuit GCC.

It should be appreciated that the switch pairs FET1-FET2 and FET3-FET4 can operate at any voltage, up to the FET device design limits, independently of the isolated gate control (or bias) circuit. It should also be appreciated that gate bias circuits are small, and may be built from (low cost), low frequency, low voltage devices while still maintaining solid RF performance. Galvanic isolation is inexpensive and directly can interface directly with microprocessors and low voltage digital logic, through digital isolator devices, or optical couplers. This facilitates simple control of RF switch functions. Thus, compared with conventional switch circuits, the switch circuit described herein allows the switch to operate over a relatively wide bandwidth, while at the same time being less lossy and more compact and power efficient than conventional switching techniques.

One competing technique which enables operation at high RF power levels is impedance transformation. However, to operate at low voltages and maintain power, the RF current levels must increase proportionally. To increase RF currents, circuit impedances must be dramatically lower. This requires impedance reduction using baluns, then low-voltage switching, then impedance increase, post switching. Accordingly, switches of this type are bulky, lossy, narrowband, and expensive compared with the novel switches described herein.

Utilizing switch-mode dc-dc conversion, and splitting the converter function, where the switching power transformer provides the galvanic isolation, and the output rectifier and filter are floated, at the RF switch bias potentials, is believed to be novel.

Having described preferred embodiments which serve to illustrate various concepts, circuits and techniques which are the subject of this patent, it will now become apparent to those of ordinary skill in the art that other embodiments incorporating these concepts, circuits and techniques may be used. For example, described herein is a specific exemplary circuit topology and specific circuit implementation for achieving a desired performance. It is recognized, however, that the concepts and techniques described herein may be implemented using other circuit topologies and specific circuit implementations. For example, any of the circuit topologies described in conjunction with FIGS. 3-3D and FIGS. 4-4C (as well as any variants thereof) may be incorporated in circuit designs such as those shown in FIGS. 5-7 (or variants of such circuit designs). Accordingly, it is submitted that that scope of the patent should not be limited to the described embodiments but rather should be limited only by the spirit and scope of the following claims.

What is claimed is:

1. A radio frequency (RF) switch having a first port and a second port, the RF switch comprising:
   a transmission line having a first end coupled to the first port of the RF switch and a second end coupled to the second port of the RF switch; and
   a switch element coupled between said transmission line and a first reference node, the first reference node to carry a first reference potential, said switch element comprising:
      a first plurality of transistors connected in a series configuration to make a four terminal device having two gate electrodes and two ohmic nodes with a first one of the ohmic nodes coupled to said transmission line and a second one of the ohmic nodes coupled to the first reference node, the first plurality of transistors having a common node between first and second transistors in the series configuration; and
      a first gate control circuit coupled to provide a floating voltage between each of the two gate electrodes and the common node and configured to isolate RF signals from the gate control circuit.

2. The RF switch of claim 1 wherein said first gate control circuit comprises:
   a floating voltage source; and
   a plurality of resistors, with a first one of the resistors coupled between a first terminal of the floating voltage source and a gate electrode of the first transistor, a second one of the resistors coupled between the first terminal of said floating voltage source and a gate electrode of the second transistor, and a third one of the resistors coupled between a second terminal of said floating voltage source and the common node.

3. The RF switch of claim 1 further comprising a second switch element coupled between said transmission line and the first reference node, said second switch element comprising:
   a second plurality of transistors connected in a series configuration to make a four terminal device having two gate electrodes and two ohmic nodes with a first one of the ohmic nodes coupled to said transmission line and a second one of the ohmic nodes coupled to the first reference node, the second plurality of transistors having a common node between first and second transistors in the series configuration, wherein the first gate control circuit is configured to provide a floating voltage between each of the two gate electrodes of the second plurality of transistors and the common node.

4. The RF switch of claim 2 wherein:
the first plurality of transistors includes third and fourth transistors coupled between the first and second transistors and the reference node in the series connection, the third and fourth transistors having a second common node therebetween;
wherein the switch element further comprises a second different gate control circuit coupled to provide a second floating voltage signal between gate electrodes associated with the third and fourth transistors and the second common node, wherein said second different gate control circuit comprises:
a second floating voltage source; and
a second plurality of resistors, with a first one of the resistors coupled between a first terminal of the second floating voltage source and a gate electrode of the third transistor, a second one of the resistors coupled between the first terminal of said second floating voltage source and a gate electrode of fourth transistor, and a third one of the resistors coupled between a second terminal of said second floating voltage source and the second common node.

5. The RF switch of claim 1 further comprising a second switch element and wherein said first switch element is coupled in shunt between said transmission line and said first reference node and said second switch element is coupled in series between the first and second ports of the RF switch.

6. The RF switch of claim 5 wherein said first and second switch elements are configured to provide one of a low insertion loss path or a high insertion loss path between the two ports of the RF switch.

7. The RF switch of claim 5 further comprising third and fourth switch elements wherein the first and second switch elements form a first 1×1 switch and the third and fourth switch elements are disposed to form a second 1×1 switch and wherein the first and second 1×1 switches are coupled to form a 1×2 switch.

8. The RF switch of claim 7 further comprising a plurality of 1×1 switches which are coupled to provide an n×m switch.

9. The RF switch of claim 7 further comprising a galvanically isolated bias circuit for providing relatively low voltage positive and negative switch bias voltage levels to individual switch elements, or groups of switch elements.

10. The RF switch of claim 9 wherein the galvanically isolated bias circuit includes a transformer to couple bias power to the switch elements.

11. The RF switch of claim 1, wherein:
if a high power RF signal travels through the RF switch from the first port to the second port when the RF switch is in an on state, a positive voltage portion of the high power RF signal will appear almost entirely across the first transistor and a negative voltage portion of the high power RF signal will appear almost entirely across the second transistor.

12. A radio frequency (RF) switch having first and second ports comprising:
a transmission line having a first end coupled to the first port of the RF switch and a second end coupled to the second port of the RF switch;
a first transistor having a first terminal coupled to the transmission line, a second terminal and a control terminal;
a second transistor having a first terminal coupled to the second terminal of the first transistor to provide a common node and a second terminal and a control terminal;
a first resistor having a first terminal coupled to the common node and a second terminal;
a second resistor having a first terminal coupled to the control terminal of the first transistor and having a second terminal;
a third resistor having a first terminal coupled to the control terminal of the second transistor and having a second terminal, wherein the second terminal of the third resistor is coupled to the second terminal of the second resistor to provide a first node; and
a floating voltage source coupled between the first node and the second terminal of the first resistor.

13. The RF switch of claim 12 wherein the first terminals of the first and second transistors each correspond to a first one of a source terminal and a drain terminal and the second terminals of the first and second transistors each correspond to a second one of a source terminal and a drain terminal.

14. The RF switch of claim 12 wherein the control electrodes of the first and second transistors correspond to gate electrodes of the first and second transistors.

15. The RF switch of claim 12, wherein:
if a high power RF signal travels through the RF switch from the first port to the second port when the RF switch is in an on state, a positive voltage portion of the high power RF signal will appear almost entirely across the first transistor and a negative voltage portion of the high power RF signal will appear almost entirely across the second transistor.

16. A radio frequency (RF) switch having first and second ports, the RF switch comprising:
a transmission line having a first end coupled to the first port of the RF switch and a second end coupled to the second port of the RF switch;
a first transistor having first, second, and third electrodes with a first one of the first, second, and third electrodes coupled to the transmission line and a second one of the first, second, and third electrodes corresponding to a control electrode;
a second transistor having a first, second, and third electrodes, with a first one of the first, second, and third electrodes coupled to a third one of first, second, and third electrodes of said first transistor to provide a common node and a second one of the first, second, and third electrodes corresponding to a control electrode;
a first resistor having a first terminal coupled to the common node and a second terminal;
a second resistor having a first terminal coupled to the control electrode of said first transistor and having a second terminal; and
a third resistor having a first terminal coupled to the control electrode of said second transistor and having a second terminal;
wherein said RF switch further comprises a bias circuit having a first terminal coupled to the second terminal of said first resistor and to the second terminal of said second resistor and having a second terminal coupled to the second terminal of said third resistor such that a floating voltage is applied from the control electrode of said first transistor to the common node and the floating voltage is applied from the control electrode of said second transistor to the common node.

17. The RF switch of claim 14 wherein said transistors are provided as field effect transistors (FETs) and said bias circuit provides a potential difference which is either positive or negative depending upon the type of FETs.

18. The RF switch of claim 16 wherein:
the first one of the first, second, and third electrodes of said first transistor corresponds to a first one of a source and drain electrode; and the first one of the first, second, and third electrodes of said second transistor corresponds to a first one of a source and drain electrode.

19. The RF switch of claim 18 wherein the control electrode of said first and second transistors corresponds to a gate electrode of said first and second transistors.

20. The RF switch of claim 16, wherein:
if a high power RF signal travels through the RF switch from the first port to the second port when the RF switch is in an on state, a positive voltage portion of the high power RF signal will appear almost entirely across the first transistor and a negative voltage portion of the high power RF signal will appear almost entirely across the second transistor.

21. A radio frequency (RF) switch having first and second ports, the RF switch comprising:
a first transistor having first, second, and third electrodes with a first one of the first, second, and third electrodes coupled to the first port of the RF switch and a second one of the first, second, and third electrodes corresponding to a control electrode;
a second transistor having first, second, and third electrodes, with a first one of the first, second, and third electrodes coupled to a third one of first, second, and third electrodes of said first transistor at a common node, a second one of the first, second, and third electrodes corresponding to a control electrode and a third one of the first, second, and third electrodes coupled to the second port of the RF switch;
a floating voltage source having a first terminal and a second terminal;
a first resistor having a first terminal coupled to the control electrode of said first transistor and having a second terminal coupled to the first terminal of the floating voltage source;
a second resistor having a first terminal coupled to the common node and having a second terminal coupled to the second terminal of the floating voltage source; and
a third resistor having a first terminal coupled to the control electrode of said second transistor and having a second terminal coupled to the first terminal of the floating voltage source.

22. The RF switch of claim 21 wherein:
the first one of the first, second, and third electrodes of said first transistor corresponds to a first one of a source and drain electrode; and
the first one of the first, second, and third electrodes of said second transistor corresponds to a first one of a source and drain electrode.

23. The RF switch of claim 22 wherein the control electrodes of said first and second transistors correspond to gate electrodes of said first and second transistors.

* * * * *